(12) United States Patent
Aas et al.

(10) Patent No.: US 8,059,019 B2
(45) Date of Patent: Nov. 15, 2011

(54) METHOD AND SYSTEM FOR MINIMIZING THE ACCUMULATED OFFSET ERROR FOR AN ANALOG TO DIGITAL CONVERTER

(75) Inventors: Arne Aas, Trondheim (NO); Gunnar Gangstoe, Trondheim (NO); Torgeir Fenheim, Trondheim (NO)

(73) Assignee: Atmel Corporation, San Jose, CA (US)

( * ) Notice: Subject to any disclaimer, the term of this patent is extended or adjusted under 35 U.S.C. 154(b) by 1192 days.

(21) Appl. No.: 11/684,572

(22) Filed: Mar. 9, 2007

(65) Prior Publication Data

US 2009/0058697 A1  Mar. 5, 2009

Related U.S. Application Data

(63) Continuation-in-part of application No. 11/467,502, filed on Aug. 25, 2006, now Pat. No. 7,292,174.

(51) Int. Cl.
   *H03M 1/06* (2006.01)
(52) U.S. Cl. .......................... 341/118; 341/143; 341/155
(58) Field of Classification Search .................. 341/118, 341/143, 155
   See application file for complete search history.

(56) References Cited

U.S. PATENT DOCUMENTS

| | | | |
|---|---|---|---|
| 4,195,283 A | 3/1980 | Ishikawa | |
| 5,278,487 A | 1/1994 | Koenck | |
| 5,408,235 A | 4/1995 | Doyle et al. | |
| 5,561,660 A * | 10/1996 | Kotowski et al. | 370/215 |
| 5,675,334 A * | 10/1997 | McCartney | 341/118 |
| 5,909,188 A | 6/1999 | Tetzlaff et al. | |
| 6,081,216 A | 6/2000 | May | |
| 6,218,809 B1 | 4/2001 | Downs et al. | |
| 6,411,242 B1 * | 6/2002 | Oprescu et al. | 341/155 |
| 6,414,619 B1 | 7/2002 | Swanson | |
| 6,456,219 B1 | 9/2002 | Schreiber et al. | |
| 6,507,171 B2 | 1/2003 | Ruha et al. | |
| 6,614,374 B1 | 9/2003 | Gustavsson et al. | |
| 6,898,534 B2 | 5/2005 | Du | |
| 6,927,717 B1 * | 8/2005 | Oprescu | 341/143 |

(Continued)

FOREIGN PATENT DOCUMENTS

EP   1239593 A2   9/2002

(Continued)

OTHER PUBLICATIONS

Davis, "TI Improves Battery Gauge", Sep. 13, 2004, [retrieved from the Internet] [retrieved Jan. 17, 2005] <URL: http://www.reed-electronics.com/electronicnews > 1 pg.

(Continued)

*Primary Examiner* — Khai M Nguyen
(74) *Attorney, Agent, or Firm* — Fish & Richardson P.C.

(57) ABSTRACT

A method and system utilized with an analog to digital converter is disclosed. The method and system comprise providing a first conversion on an input signal. In the first conversion, an offset error is added to the input signal to provide a first result. The method and system further includes providing a second conversion on the input signal. In the second conversion, an offset error is subtracted from the input signal to provide a second result. The first and second results are then combined to substantially remove the offset error. A system and method in accordance with the present invention compensates for the accumulated offset error over many samples, thereby achieving much higher accuracy in the offset error compensation.

28 Claims, 3 Drawing Sheets

U.S. PATENT DOCUMENTS

| | | | |
|---|---|---|---|
| 7,362,255 B1 * | 4/2008 | Tsyrganovich | 341/172 |
| 2005/0062457 A1 | 3/2005 | Galant et al. | |
| 2005/0123072 A1 | 6/2005 | Guimaraes | |
| 2005/0219096 A1 | 10/2005 | Freeman et al. | |

FOREIGN PATENT DOCUMENTS

| | | |
|---|---|---|
| WO | WO-2008/112070 A1 | 9/2008 |

OTHER PUBLICATIONS

Barsukov et al., "Fuel gauge technology predicts run time in multi-cell portable applications", 2004 [retrieved from the Internet] [retrieved Jan. 13, 2005] <URL: http://www.ednasia.com/article.asp?id=108 > pp. 1-5.

Analog Devices, "Integrated Precision Battery Sensor For Automotive" Preliminary Technical Data, Analog Devices, Inc., Norwood MA, 2006.

"International Application Serial No. PCT/US2008/002338, International Search Report mailed May 27, 2008", 4 pgs.

"International Application Serial No. PCT/US2008/002338, Written Opinion mailed May 27, 2008", 11 pgs.

Lee, B. G., et al., "A New Ratio-Independent A/D conversion Technique for High-Resolution Pipeline A/D Converters", *IEEE International Symposium on Circuits and Systems (ISCAS 2005)*, vol. 3, (2005), 1960-1963.

Min, B.-M., et al., "A 69-mW 10-bit 80-MSample/s Pipelined CMOS ADC", *IEEE Journal of Solid-State Circuits*, 38(12), (2003), 2031-2039.

* cited by examiner

METHOD AND SYSTEM FOR MINIMIZING THE ACCUMULATED OFFSET ERROR FOR AN ANALOG TO DIGITAL CONVERTER

CROSS REFERENCE TO RELATED APPLICATIONS

This application is a continuation-in-part of U.S. patent application Ser. No. 11/467,502, filed Aug. 25, 2006, now issued as U.S. Pat. No. 7,292,174, entitled "Current sensing analog to digital converter and method of use," and is also related to U.S. Pat. No. 7,113,122, filed Jan. 25, 2005, entitled, "Current sensing analog to digital converter and method of use".

FIELD OF THE INVENTION

The present invention relates generally to integrated circuits and more specifically to a current sensing analog to digital converter that is utilized in such circuits.

BACKGROUND OF THE INVENTION

Analog-to-digital converters have a certain offset error. Offset error is the difference between the measured and ideal voltage at the analog input that produces the midscale code at the outputs. There are known techniques to minimize the offset error, such as symmetrical design and layout, and automatic offset error compensation techniques. Even when using such methods, there is some offset error in the design. Typically, a well-designed differential analog to digital converter implemented in CMOS may have a temperature-dependent offset error of about 100 µV. In certain applications, the analog to digital converter results are accumulated over time. In this case, the amount of offset error will accumulate, causing a significant error in the result, particularly if the input levels to the analog digital converter are very low for long periods.

Existing methods for automatic offset error cancellation compensate for the offset error in every sample, for example, by first accumulating the offset error in a sampling capacitor and then sampling the signal level each result in such a way that the offset error is subtracted. However it is known that this method of offset error cancellation can be inaccurate when the analog to digital converter is utilized over a long period of time because the offset error can accumulate. This is typically the case for fuel gauging in battery systems. What is needed is a more effective method for reducing offset error in analog to digital converters. The system should be cost effective, easily implemented and adaptable to exiting systems.

The present invention addresses such a need.

SUMMARY OF THE INVENTION

A method and system utilized with an analog to digital converter is disclosed. The method and system comprise providing a first conversion on an input signal. In the first conversion, an offset error is added to the input signal to provide a first result. The method and system further includes providing a second conversion on the input signal. In the second conversion, an offset error is subtracted from the input signal to provide a second result. The first and second results are then combined to substantially remove the offset error.

A system and method in accordance with the present invention compensates for the accumulated offset error over many samples, thereby achieving much higher accuracy in the offset error compensation. For one implementation in CMOS, the existing methods for automatic offset error cancellation were able to achieve an offset error level of approximately 100 µV, while the method in accordance with the present invention could reduce the accumulated offset error to about 1 µV.

DETAILED DESCRIPTION

The present invention relates generally to integrated circuits and more specifically to a current sensing analog to digital converter that is utilized in such circuits. The following description is presented to enable one of ordinary skill in the art to make and use the invention and is provided in the context of a patent application and its requirements. Various modifications to the preferred embodiments and the generic principles and features described herein will be readily apparent to those skilled in the art. Thus, the present invention is not intended to be limited to the embodiments shown, but is to be accorded the widest scope consistent with the principles and features described herein.

Overview of the Current Sensing Analog to Digital Converter

Figure 1:
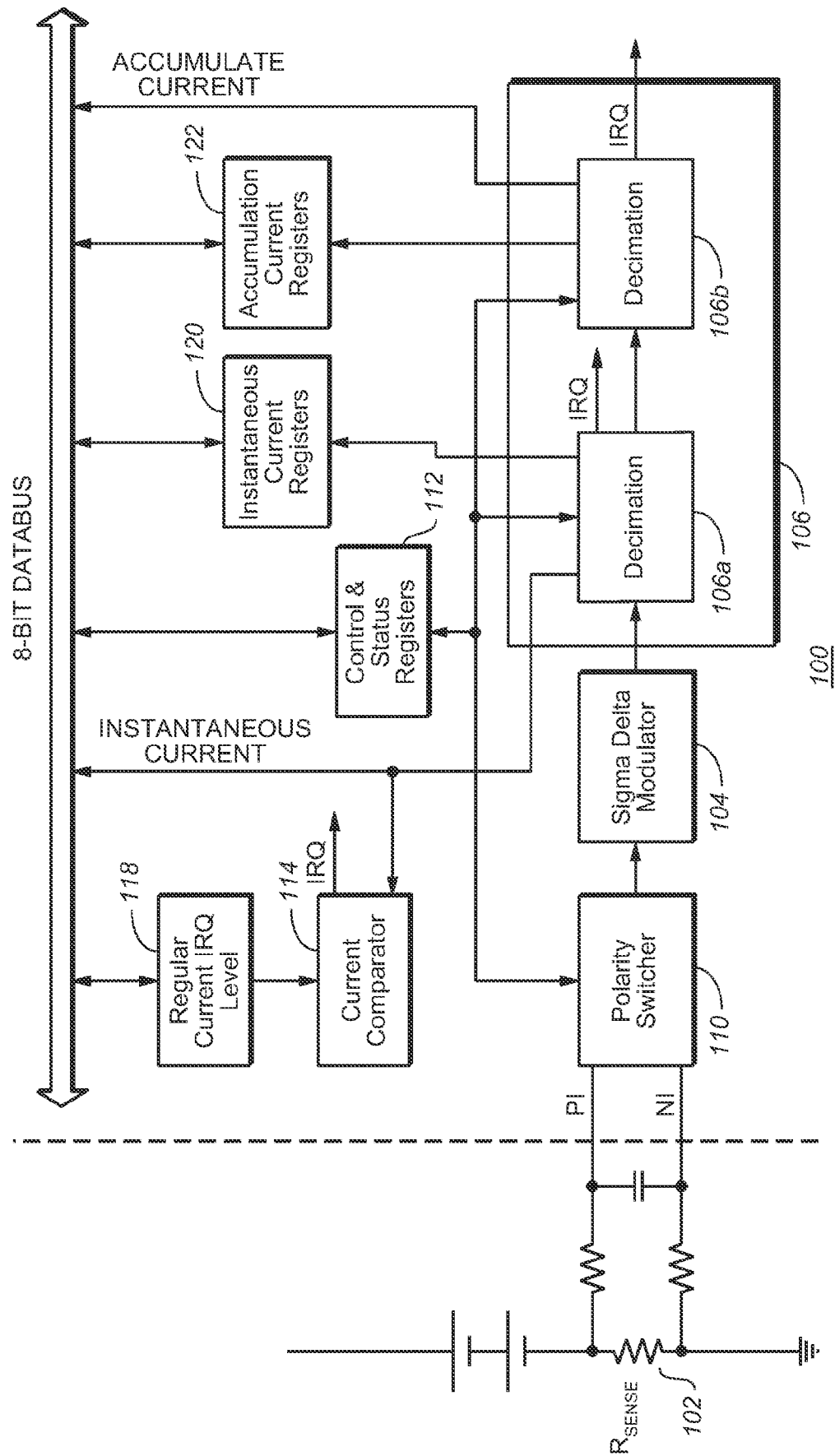
FIG. 1 shows the block diagram of a current sensing analog to digital converter analog to digital converter in accordance with the present invention.

FIG. 1 shows the block diagram of a current sensing analog to digital converter 100 in accordance with the present invention. The analog to digital converter 100 has many of the features described in U.S. application Ser. No. 11/467,502, entitled "Current sensing analog to digital converter and method of use," assigned to the assignee of the present invention and incorporated in its entirety herein.

The analog to digital converter 100 is used to sample the charge or discharge current flowing through an external sense resistor $R_{SENSE}$ 102. The analog to digital converter 100 could be part of a variety of devices such as a microcontroller, digital signal processor (DSP), digital camera, PDA, or the like. In one embodiment the analog to digital converter 100 is part of an 8 bit microcontroller. The sample from the $R_{SENSE}$ 102 is processed by a sigma delta modulator 104 via a polarity switcher 110. In an improvement to the above-identified patent application which will be described in detail later in this application, the analog to digital converter 100 also a polarity switcher 110 which is coupled to the modulator 104, the decimation filters 106a and 106b and the control and status registers 112.

The modulator 104 generates an over sampled noise shaped (most of the noise energy in high frequencies) signal (typically the signal is 1 bit). From this signal, the two decimation filters 106a and 106b of the CDAC filter 106, remove the out-of band noise and reduce the data rate to achieve a high-resolution signal.

The two decimation filters 106a and 106b generate two data values, instantaneous current and accumulate current, respectively. The instantaneous current has a short conversion time at the cost of lower resolution. The accumulate current output provides a current measurement for coulomb counting. The conversion time of the accumulation current can be configured to trade accuracy against conversion time.

The analog to digital converter 100 also provides regular current detection. The regular current detection compares the data from conversion against charge/discharge threshold levels specified by the user. To save power a special mode where the user configures the regular current sampling interval via the control and status registers 112 is provided. The analog to digital converter 100 then in one embodiment performs four instantaneous current conversions (the first three conversions are dummy conversions to ensure proper settling of the decimation filters 106a and 106b) and compares the last conversion value with the threshold levels specified by the user via current comparator 114. If the value is above the threshold a wakeup signal is given to a sleep controller (not shown) and interrupts for instantaneous and regular current are given. If not, the modulator 104 and the decimation filter 106 are turned off for some time, before starting over again. The user specifies the time period the modulator 104 and filter 106 should be turned off. This allows ultra-low power operation in power-save mode when small charge or discharge currents are flowing. The analog to digital converter 106 filter generates interrupts on conversion complete from the instantaneous current and accumulation current, and when a regular current is detected.

As has been above described the offset error occurs when using analog to digital converters and it is desirable to minimize this offset error to improve the accuracy of the analog to digital converter. A system and method in accordance with the present invention minimizes the offset error by compensating for the accumulated offset error over many samples, thereby achieving much higher accuracy in the offset error compensation. To describe the features of the present invention in more detail refer now to the following description in conjunction with the accompanying figures.

Figure 2:
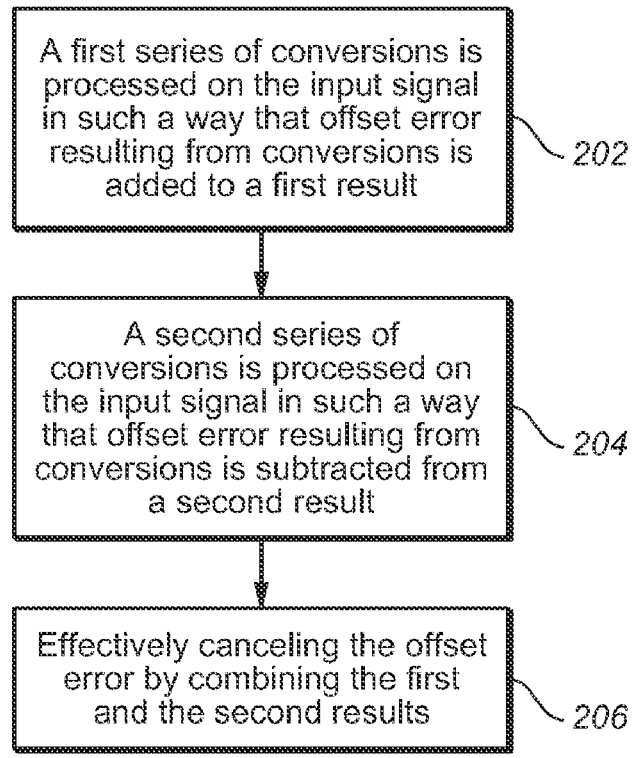
FIG. 2 is a flow chart which illustrates reducing the accumulated offset error in an analog to digital converter to a very low value in accordance with the present invention.

FIG. 2 is a flow chart which illustrates reducing the accumulated offset error in an analog to digital converter to a very low value in accordance with the present invention.

In a first state, a first series of conversions is processed on an input signal in such a way that the offset error resulting from the conversions is added to a first result, via step 202. In a second state, a second series of conversions is processed on the input signal in such a way that the offset error resulting from the conversions is effectively subtracted from a second result, via step 204. Finally, the result of combining these first and second results is the offset error is effectively cancelled in the analog to digital converter, via step 206.

The actual implementation of the method in accordance with the present invention does not change the polarity of the offset error, since this is very difficult to achieve accurately. Instead, it changes the polarity of the input signal without changing the polarity of the offset error. Then, it changes the polarity of the result, which results in the input signal having the correct polarity and an offset error having an opposite polarity. Since offset error is added in the first series, and subtracted in the second series, as shown above, the net result is that the offset error is cancelled out. This method is particularly useful in applications where the sum of a long series of measurements is calculated. One example of this could be utilized for fuel gauging in battery systems (remaining capacity calculations).

To describe an implementation of this feature in an analog to digital converter refer now to the following description in conjunction with the accompanying figures. Referring back to FIG. 1, the key components for implementing offset error compensation in accordance with the present invention are the modulator 104 and the polarity switcher 110. Their operation and interaction will be discussed in detail herein below.

Sigma Delta Modulator 104

In this embodiment a sigma delta modulator 104 is disclosed. However, one of ordinary skill in the art recognizes that a variety of types of modulators such as those utilized in a successive approximation ADC, a pipeline ADC or the like and also be within the spirit and scope of the present invention. Typically, the modulator 104 is an analog module. The modulator 104 samples the input signal a number of times ("oversampling") to make one single conversion, e.g., 128 times. Each conversion is output as a number that is accumulated in the decimation filters 106a and 106b.

The two decimation filters 106a and 106b accumulate the numbers from the modulator 104. The end result is therefore one number consisting of the sum of all the numbers from the modulator 104 (for example 18 bits) corresponding to one conversion. The numbers from the modulator 104 have much fewer bits, typically only 1 or 2 bits. The high accuracy in the result is achieved by the oversampling and accumulation.

Polarity Switcher 110

Figure 3:
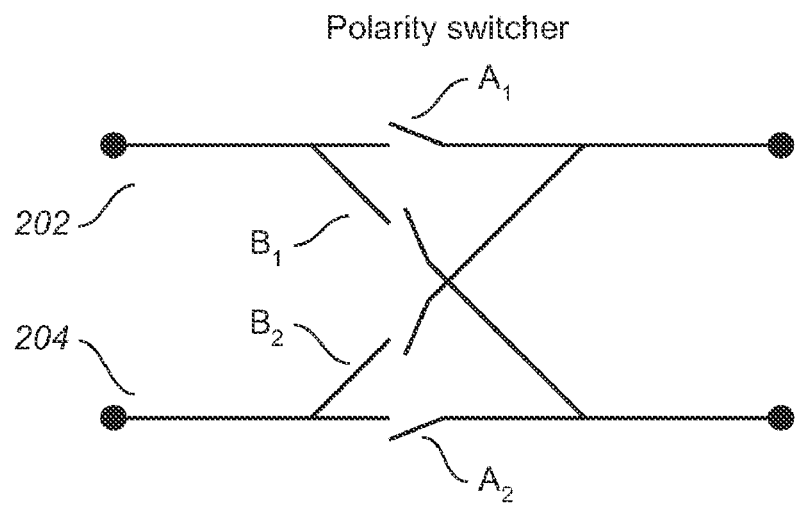
FIG. 3 shows a polarity switcher in accordance with the present invention.

FIG. 3 shows a polarity switcher 110 in accordance with the present invention. The polarity switcher 110 changes the polarity of the input signal based upon signals from the control registers. As is seen, when lines 202 and 204 are coupled in positions A the polarity is normal, and when the lines 202 and 204 are coupled in position B the polarity is reversed. In a preferred embodiment the polarity switcher 110 is implemented in hardware.

It is known that the biggest source of offset error in the analog to digital converter is the modulator 104. There will also be some other sources to offset error, e.g., the external components and the input pins. The majority of the offset error is, however, in the modulator 104. Accordingly a system and method in accordance with the present invention effectively removes the offset error caused by the modulator 104. Accordingly, referring back to FIG. 2, the result of the analog to digital converter measurements in the steps 202 and 204 on the analog to digital converter 100 of FIG. 1 are shown below:

Step 202: Result 1=input signal+external offset error+input pin offset error+polarity switcher offset error in state 1+Sigma Delta offset error.

Step 204: Result 2=−input signal−external offset error−input pin offset error+polarity switcher offset error in state 2+Sigma Delta offset error.

When the polarity of the Result 2 (i.e., by inverting the input signal) and averaging the two results, the final result is as follows:

Average=((input signal+external offset error+input pin offset error+polarity switcher offset error in state 1+Sigma Delta offset error)+(input signal+external offset error+input pin offset error−polarity switcher offset error in state 2−Sigma Delta offset error))/2

=input signal+external offset error+input pin offset error+ (polarity switcher offset error in state 1−polarity switcher offset error in state 2)/2

As is seen, the modulator offset error is effectively removed as a result of this process. The external offset error and input pin offset error are not altered, but as before mentioned these are very small compared to the modulator offset error, which is typically two orders of magnitude greater. An offset error is introduced by the polarity switcher 110. However, this is also very small compared to the modulator 104 offset error, which also is typically two orders magnitude greater. Therefore, the end result is improved by about two orders of magnitude.

The above described offset error compensation feature can be implemented in a variety of embodiments, two of which are described below. Firstly, a microcontroller system is described which utilizes the ADC in accordance with the present invention.

Figure 4:
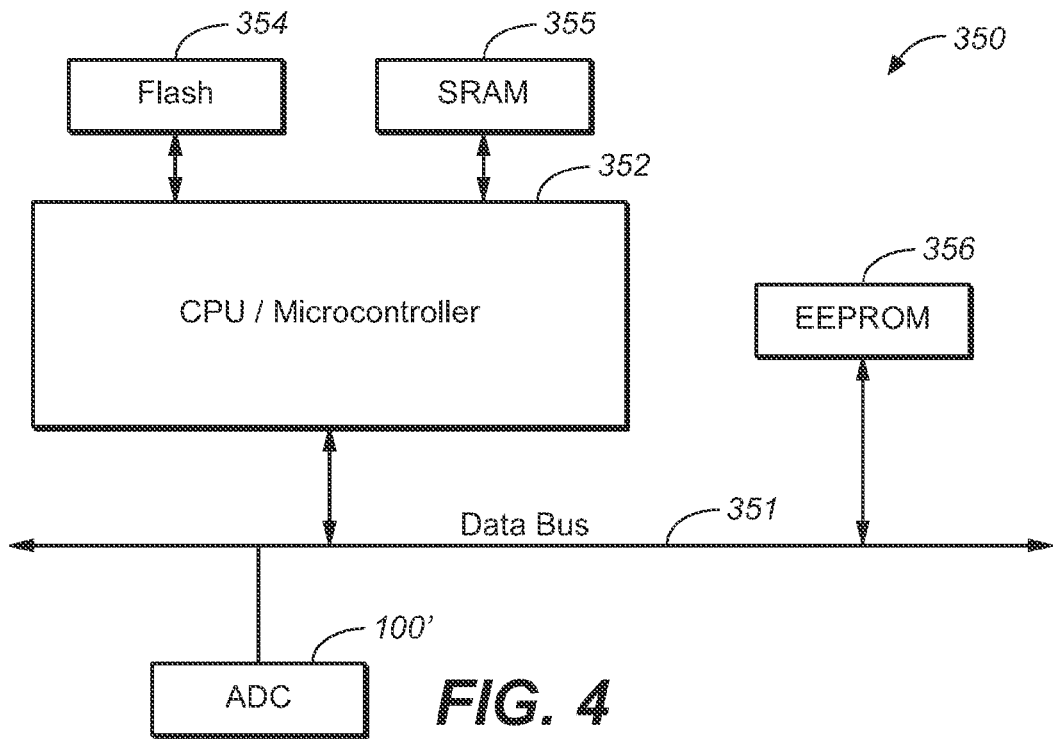
FIG. 4 is a block diagram of a system which utilizes the analog to digital converter in accordance with the present invention.

FIG. 4 is a block diagram of a system 350 which utilizes the analog to digital converter in accordance with the present invention. The system includes a CPU or microcontroller 352 which is coupled to a data bus 351. The microcontroller 352 includes memory units 354-356 for holding software programs that will be executed by the microcontroller 352. The system 350 further includes an analog to digital converter 100' in accordance with the present invention.

Embodiment 1

In the first embodiment:
(1) The polarity switcher 110 is added in hardware; and
(2) Software controls the polarity switcher 110 (step 204, FIG. 2).

Figure 5:
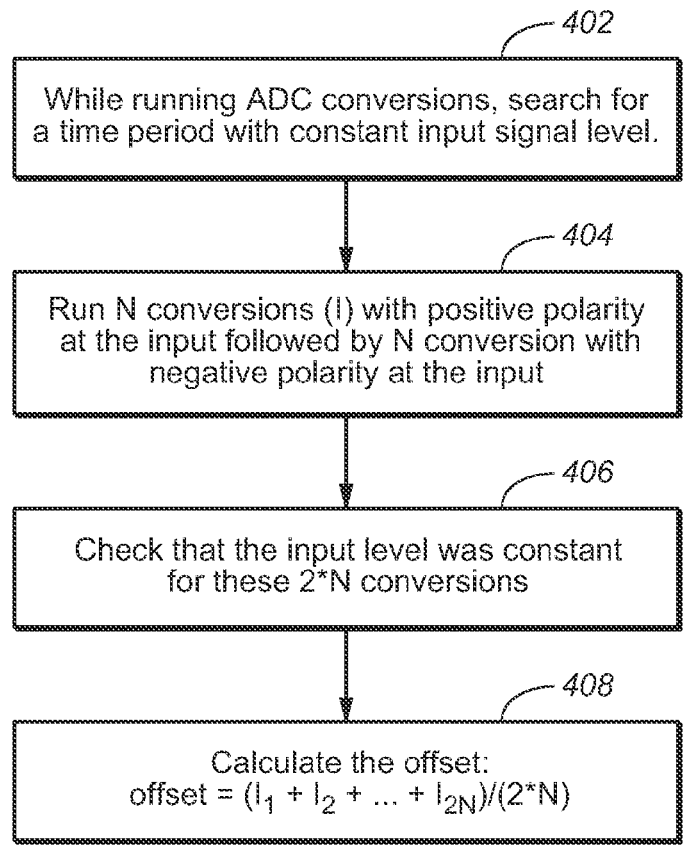
FIG. 5 is a flow chart which illustrates a software program which provides control of the polarity switch.

FIG. 5 is a flow chart which illustrates a software program which provides control of the polarity switch. First, while running the analog to digital conversions, a search is conducted for a time period where the input signal is at a constant input level, via step 402. Thereafter N conversions (I) are run with a positive polarity at the input, followed by N conversions with negative polarity at the input, via step 404. Next it is determined if the input level signal was constant for 2*N conversions, via step 406. Finally, the offset is calculated by the formula offset=$(I_1+I_2+\ldots+I_{2n})/(2*N)$ to find the average, via step 408. In so doing, the offset can be measured on a regular basis.

The flow chart describes an efficient way to measure actual offset without interrupting ongoing ADC conversions. This can be useful in a battery monitoring system where the ADC runs continuously to accumulate the charge flowing in and out of the battery. In idle periods, the current level is very stable for long periods, and these periods can be used to measure and update the actual offset level of the ADC.

The end result from the analog to digital converter is not inverted. Therefore, software has to invert the results when the polarity switcher is in state 2.

As will be explained in more detail below, a number of conversions must be run in state 1 (step 204, FIG. 2), and then a number of conversions must be run in state 2. The conversions are carried out by software. The recommended number of conversions that must be run in this particular implementation is 16.

Embodiment 2

In the second embodiment:
(1) The polarity switcher 110 is added in hardware.
(2) Software controls the polarity switcher 110.

However, in this embodiment, the modulator 104 inverts the output signal before the filter 106. Therefore software no longer needs to invert the results when the polarity switcher 110 is in state 2. This second embodiment also has additional advantages listed below:

1. The filter 106 is presented a more stable value when the polarity switcher 110 changes.

2. Any hardware use of the accumulated value needs polarity correction in hardware. Changing polarity at this point gives the lowest cost hardware solution, since the number is typically only 1 bit. One example of hardware use of the accumulated value is the "regular current detection" feature that detects if the value is above a certain limit. This can be performed, for example, by the current comparator 114.

It is not required to implement the polarity switcher control in software. It can also be implemented in hardware. However, software control provides flexibility.

The decimation filter 106 as before mentioned post-processes and integrates the samples. Whenever the analog to digital converter is enabled, the filter 106 normally requires a few conversions to "settle" before it gives the correct output value. This is because the registers in the filter 106 start at a default setting (typically zero). The same is required after large changes in the input value. Note that whenever the polarity is switched, this looks like an abrupt change in the input signal level, and the filter 106 requires some time to settle to this new value. Therefore, it is not recommended to switch polarity for every conversion. Running a number of conversions with one polarity setting, and then the same number with the opposite polarity setting, gives the best results. The number of conversions depends on filter 106 settling time and other factors. Therefore, the chosen solution allows the number of conversions to be determined by software. Other implementations may choose to fix the number of conversions in hardware.

In embodiment 2, the problem with settling time of the filter 106 is avoided by inverting the output from the modulator 104 when the input is sampled with opposite polarity, thereby presenting a stable value to the filter 106. Embodiment 2 would allow switching the polarity each cycle if the modulator 104 does not have a similar settling effect.

Although the present invention has been described in accordance with the embodiments shown, one of ordinary skill in the art will readily recognize that there could be variations to the embodiments and those variations would be within the spirit and scope of the present invention. The analog to digital converter in accordance with the present invention can be utilized in a variety of devices such as a microcontroller, digital signal processor or other types of integrated circuits. The features of the present invention could be utilized with a variety of analog to digital converters and are not limited in any way to the current sensing analog to digital converter disclosed in the present invention. Accordingly, many modifications may be made by one of ordinary skill in the art without departing from the spirit and scope of the appended claims.

What is claimed is:

1. A method utilized with an analog to digital converter comprising:

providing a first conversion on an input signal, wherein an offset error is added to the input signal to provide a first result and wherein the first conversion comprises a first set of n conversions;

providing a second conversion on the input signal, wherein the offset error is subtracted from the input signal to provide a second result and wherein the second conversion comprises a second set of n conversions; and combining the first and second results to substantially remove the offset error of the analog to digital converter, wherein a value of n is based on a settling time associated with a filter.

2. The method of claim 1 wherein the offset error is associated with a modulator within the analog to digital converter.

3. The method of claim 2 wherein the polarity of the first conversion of the input signal is opposite that of the polarity of the second conversion of the input signal.

4. The method of claim 3 wherein the combining step comprises inverting the polarity of the second result and averaging the first and second results, wherein the modulator offset error is removed.

5. The method of claim 4 wherein the combining step is controlled by software.

6. The method of claim 4 wherein software inverts the second result.

7. The method of claim 4 wherein hardware within the modulator inverts the second result.

8. An analog to digital converter comprising:
a modulator adapted to generate an oversampled signal;
a digital filter coupled to the modulator for removing out of band noise and for reducing the data rate to achieve a high resolution signal;
a polarity switcher coupled to the modulator for switching the polarity of an input signal to the modulator; and
a control mechanism for controlling the polarity switcher, the control mechanism for providing a first conversion on an input signal, wherein an offset error is added to the input signal to provide a first result and wherein the first conversion comprises a first set of n conversions; for providing a second conversion on the input signal, wherein the offset error is subtracted from the input signal to provide a second result and wherein the second conversion comprises a second set of n conversions; and for combining the first and second results to substantially remove the offset error, wherein a value of n is based on a settling time associated with the digital filter.

9. The analog to digital converter of claim 8 wherein the modulator comprises a sigma delta modulator.

10. The analog to digital converter of claim 8 wherein the digital filter comprises first and second decimation filters, wherein the first decimation filter provides an instantaneous current output and the second decimation filter provides accumulate current output.

11. The analog to digital converter of claim 8 wherein the control mechanism comprise software.

12. The analog to digital converter of claim 8 wherein the polarity of the first conversion of the input signal is opposite that of the polarity of the second conversion of the input signal.

13. The analog to digital converter of claim 12 wherein the combining step comprises inverting the polarity of the second result and averaging the first and second results, wherein the modulator offset error is removed.

14. The analog to digital converter of claim 13 wherein the polarity switcher is controlled by software.

15. The analog to digital converter of claim 13 wherein the software inverts the second result.

16. The analog to digital converter of claim 13 wherein hardware within the modulator inverts the second result.

17. A system comprising:
a microcontroller; and
an analog to digital converter being integrated into the microcontroller, the analog to digital converter comprising a modulator adapted to generate an oversampled signal; a digital filter coupled to the modulator for removing out of band noise and for reducing the data rate to achieve a high resolution signal; a polarity switcher coupled to the modulator for switching the polarity of an input signal to the modulator; and a control mechanism for controlling the polarity switcher, the control mechanism providing a first conversion on an input signal, wherein an offset error is added to the input signal to provide a first result and wherein the first conversion comprises a first set of n conversions; providing a second conversion on the input signal, wherein the offset error is subtracted from the input signal to provide a second result and wherein the second conversion comprises a second set of n conversions; and combining the first and second results to substantially remove the offset error, wherein a value of n is based on a settling time associated with the digital filter.

18. A computer readable medium encoded with a computer program comprising instructions that when executed, operate to cause a machine to perform operations:
providing a first conversion on an input signal, wherein an offset error is added to the input signal to provide a first result and wherein the first conversion comprises a first set of n conversions;
providing a second conversion on the input signal, wherein the offset error is subtracted from the input signal to provide a second result and wherein the second conversion comprises a second set of n conversions; and
combining the first and second results to substantially remove the offset error of the analog to digital converter wherein a value of n is based on a settling time associated with a filter.

19. The computer readable medium of claim 18 wherein the offset error is provided by a modulator within the analog to digital converter.

20. The computer readable medium of claim 19 wherein the polarity of the first conversion of the input signal is opposite that of the polarity of the second conversion of the input signal.

21. The computer readable medium of claim 20 wherein the combining step comprises inverting the polarity of the second result and averaging the first and second results, wherein the modulator offset error is removed.

22. The computer readable medium of claim 21 wherein the combining step is controlled by software.

23. The computer readable medium of claim 21 wherein the software inverts the second result.

24. The computer readable medium of claim 21 wherein hardware within the modulator inverts the second result.

25. A method utilized with an analog to digital converter comprising:
providing a first conversion on an input signal via a polarity switcher, wherein an offset error is added to the input signal to provide a first result and wherein the first conversion comprises a first set of n conversions;
providing a second conversion on the input signal via the polarity switcher, wherein the offset error is subtracted from the input signal to provide a second result, wherein the second conversion comprises a second set of n conversions and wherein the polarity switcher is controlled by software; and
combining the first and second results to substantially remove the offset error of the analog converter wherein the offset error is measured without interrupting conversions of the input signal, wherein a value of n is based on a settling time associated with a filter.

26. An analog to digital converter comprising:
a modulator adapted to generate an oversampled signal;
a digital filter coupled to the modulator for removing out of band noise and for reducing the data rate to achieve a high resolution signal;
a polarity switcher coupled to the modulator for switching the polarity of an input signal to the modulator; and
a software program for controlling the polarity switcher, the software program for providing a first conversion on an input signal, wherein an offset error is added to the input signal to provide a first result and wherein the first conversion comprises a first set of n conversions; for providing a second conversion on the input signal, wherein the offset error is subtracted from the input signal to provide a second result and wherein the second conversion comprises a second set of n conversions; and for combining the first and second results to substantially remove the offset error wherein the offset error is measured without conversions of the input signal wherein a value of n is based on a settling time associated with the digital filter.

27. A system comprising:

a microcontroller; and an analog to digital converter being integrated into the microcontroller, the analog to digital converter comprising a modulator adapted to generate an oversampled signal;

a digital filter coupled to the modulator for removing out of band noise and for reducing the data rate to achieve a high resolution signal;

a polarity switcher coupled to the modulator for switching the polarity of an input signal to the modulator; and a software program for controlling the polarity switcher, the software program providing a first conversion on an input signal, wherein an offset error is added to the input signal to provide a first result and wherein the first conversion comprises a first set of n conversions; providing a second conversion on the input signal, wherein the offset error is subtracted from the input signal to provide a second result and wherein the second conversion comprises a second set of n conversions; and combining the first and second results to substantially remove the first error wherein the offset error is measured without conversions of the input signal and wherein a value of n is based on a settling time associated with the digital filter.

28. A computer readable storage medium containing program instructions utilized with an analog to digital converter, the program instructions for:

providing a first conversion on an input signal via the polarity switcher, wherein an offset error is added to the input signal to provide a first result and wherein the first conversion comprises a first set of n conversions;

providing a second conversion on the input signal via the polarity switcher, wherein the offset error is subtracted from the input signal to provide a second result, wherein the second conversion comprises a second set of n conversions and wherein the polarity switcher is controlled by software; and combining the first and second results to substantially remove the offset error of the analog to digital converter wherein the offset error is measured without conversions of the input signal and wherein a value of n is based on a settling time associated with a digital filter.

* * * * *

UNITED STATES PATENT AND TRADEMARK OFFICE
CERTIFICATE OF CORRECTION

PATENT NO. : 8,059,019 B2
APPLICATION NO. : 11/684572
DATED : November 15, 2011
INVENTOR(S) : Arne Aas, Gunnar Gangstoe and Torgeir Fenheim It is certified that error appears in the above-identified patent and that said Letters Patent is hereby corrected as shown below:

In Claim 6, column 7, line 7, delete "wherein" and insert -- wherein the --.

In Claim 11, column 7, line 38, delete "comprise" and insert -- comprises --.

Signed and Sealed this
Twenty-seventh Day of March, 2012

David J. Kappos
*Director of the United States Patent and Trademark Office*